United States Patent [19]

Arlan et al.

[11] Patent Number: 4,660,096
[45] Date of Patent: Apr. 21, 1987

[54] DIVIDING HIGH-RESOLUTION-CAMERA VIDEO SIGNAL RESPONSE INTO SUB-IMAGE BLOCKS INDIVIDUALLY RASTER SCANNED

[75] Inventors: Lionel Arlan, Lexington; Peter W. Westcott, Billerica; Paul J. Mageau, Townsend, all of Mass.

[73] Assignee: RCA Corporation, Princeton, N.J.

[21] Appl. No.: 680,569

[22] Filed: Dec. 11, 1984

[51] Int. Cl.[4] .............................................. G11B 7/00
[52] U.S. Cl. .................... 358/310; 358/108; 358/93; 358/335; 358/342; 360/35.1; 360/9.1
[58] Field of Search ................ 358/294, 93, 108, 342, 358/335, 310, 906; 360/35.1, 32, 9.1, 8

[56] References Cited

U.S. PATENT DOCUMENTS

| 3,697,678 | 10/1972 | Belleson | 178/6.6 DD |
|---|---|---|---|
| 3,794,758 | 2/1974 | Dudley | 178/6.8 |
| 3,803,352 | 4/1974 | Goldberger | 360/9.1 |
| 3,983,328 | 9/1976 | Newell | 178/6.8 |
| 4,090,223 | 5/1978 | Holt | 360/35.1 |
| 4,139,869 | 2/1979 | Holt | 360/35.1 |
| 4,400,727 | 8/1983 | Aron | 358/103 |
| 4,485,409 | 11/1984 | Schumacher | 358/294 |
| 4,577,240 | 3/1986 | Hedberg et al. | 360/35.1 X |

Primary Examiner—Robert L. Richardson
Attorney, Agent, or Firm—Joseph S. Tripoli; Allen LeRoy Limberg; Allen E. Amgott

[57] ABSTRACT

A system for recording a high resolution still video image consists of a memory for storing the image. The memory is addressed so that portions of the high resolution image may be read out to form video sub-images corresponding to a conventional video format, such as the NTSC standard. Each of these standard format sub-images is then stored on a video disk. Upon playback of the video disk to retrieve the images, each of the sub-images is stored in a memory in a fashion such that when all of the sub-images are so stored the entire memory may be read out to produce a reconstituted version of the high resolution video image.

21 Claims, 2 Drawing Figures

DIVIDING HIGH-RESOLUTION-CAMERA VIDEO SIGNAL RESPONSE INTO SUB-IMAGE BLOCKS INDIVIDUALLY RASTER SCANNED

The present invention relates to an apparatus for storing and retrieving still color video images.

BACKGROUND OF THE INVENTION

Many applications exist for the storage of a high resolution color still video image. One such application involves the storage of large area maps which often have line widths as small as 0.004 inches, especially when such maps are to be used for military applications. Although high definition video cameras, recorders and displays have been recently developed, it is highly desirable from both a cost and an availability standpoint to utilize standard commercially available equipment in such storage systems. However, commercial equipment is normally designed to record video information which conforms to conventional broadcast television standards such as those promulgated by the NTSC. This recording equipment typically processes the video as a composite color signal typically having a 3 MHz. luminance bandwidth and a chrominance bandwidth limited to about 0.5 MHz. This limited chrominance bandwidth severely restricts the resolution of the still image, and is inadequate to record full color maps having very fine line widths.

SUMMARY OF THE INVENTION

A system for storing and retrieving high resolution still video images comprises a means for dividing the high resolution image into a plurality of video sub-images. Each of the video sub-images is then separately recorded in a storage means. The playback of the stored image is accomplished by retrieving the video sub-images and feeding them to a means for reconstituting the high resolution video image from the retrieved video sub-images.

DETAILED DESCRIPTION OF THE PREFERRED EMBODIMENT

Figure 1:
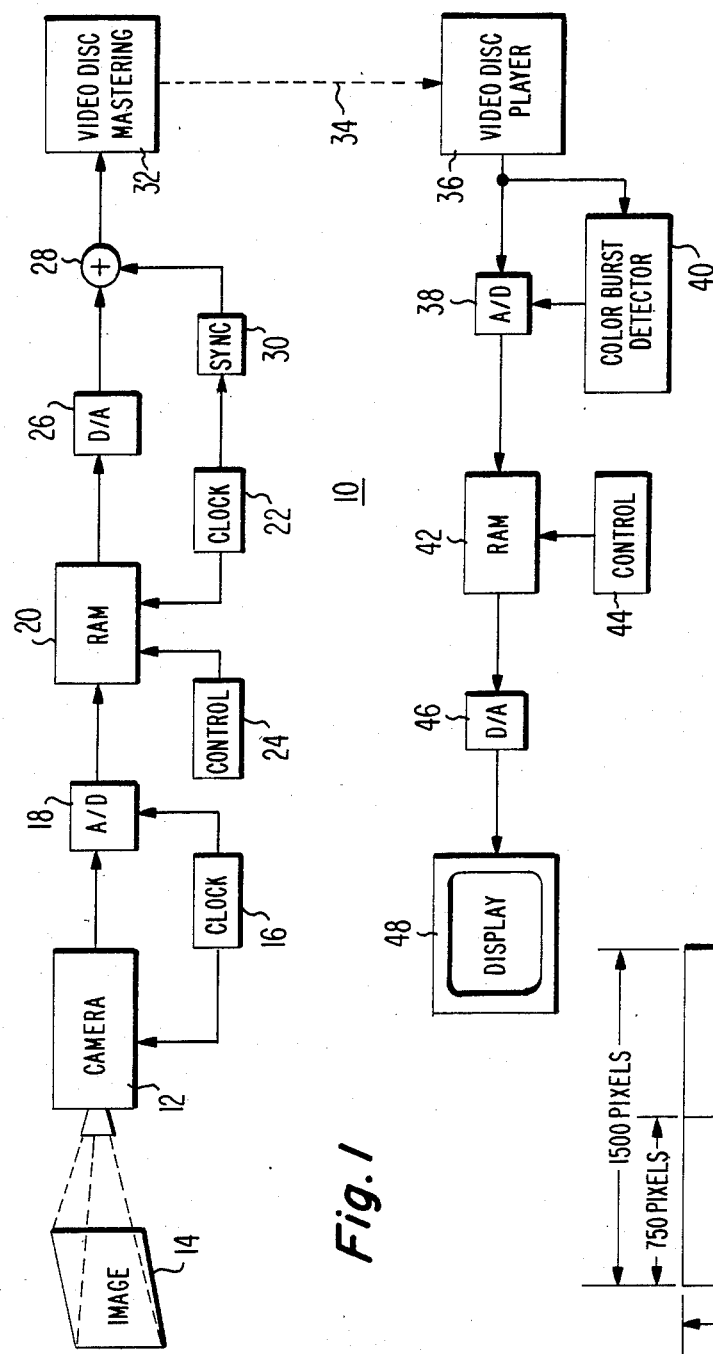
FIG. 1 is a block diagram of a system for storing and retrieving still high resolution video images.
Figure 2:
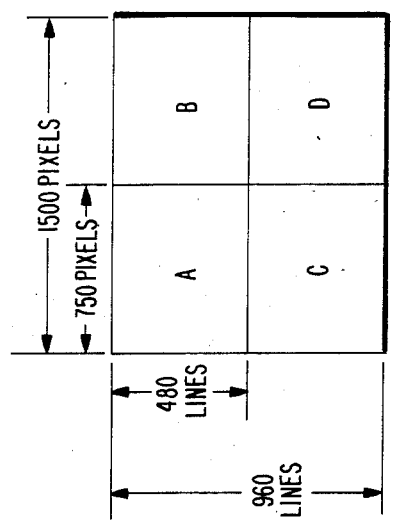
FIG. 2 is a representation of a high resolution video image and its video sub-images.

With initial reference to FIG. 1, a system 10 for storing and retrieving a still video image includes a high resolution camera 12 which is focused on the still image 14 to be stored. The high resolution camera 12 may be of several commercially available devices for producing high resolution composite video color images. For example, if a conventional NTSC storage device is to be used in the system as will be subsequently described in detail, the high resolution camera 12 may have 1024 scan lines each containing 1500 picture elements (pixels). This type of camera would, therefore, have approximately 960 usable lines in the video signal (the remainder of the lines being used for vertical retrace) thereby producing a video image having 1500×960 pixels (FIG. 2). The camera 12 receives its synchronizing signal from an external clock 16. Although, the present application describes the invention in terms of the NTSC television standards, it will be apparent to those skilled in the art that other standard or non-standard systems can be used to practice this invention.

The video output from the camera 12 is fed to the input of a first analog-to-digital converter 18 which provides a digital conversion of the video signal from the camera producing an eight-bit word for each pixel in the video image. The rate of the analog-to-digital conversion is also controlled by clock 16. The digitized video image is stored in a 12 megabit random access memory (RAM) 20 so that the eight bits for each of the 1500×960 pixels may be stored and independently accessed in the RAM. The RAM clocking signal from a second clock 22 runs at four times the 3.58 MHz NTSC color subcarrier frequency. The addressing of the RAM 20 is governed by a control unit 24. The output, when RAM 20 is read, is fed to the input of a first digital-to-analog converter 26 having its output coupled as one input to a video mixer 28. The other input of the mixer 28 is coupled to the output of a horizontal sync circuit 30 which divides the 14.3 MHz output from clock 22 by a factor of four to produce the standard NTSC color burst and which further divides this signal to produce the horizontal and vertical sync pulses.

The output from the mixer 28 is then sent to a video recording system for archival storage of the RAM output signal. As shown in FIG. 1, this archival storage may comprise a video system whereby the output mixer 28 is fed to a video disk mastering apparatus 32 to produce a video disk containing the video output images from the mixer 28.

The description of the system 20 heretofore has included all of the elements necessary for storing the high resolution still video image. An image 14 such as a very detailed map may be stored by the system 10 as follows. The camera 12 produces a high resolution video image containing approximately 1500×960 pixels. The image is digitized by the A/D converter 18 and stored in the RAM 20. The manner in which the digitized image is stored in the RAM is known so that individual scan lines and portions of a video signal scan line may be accessed by addressing particular storgage locations in the RAM.

For example, the RAM memory is then selectively addressed for readout at a 14.3 megahertz sample word rate so that a single quadrant of 750×480 pixels may be read out to form a standard NTSC video signal. With reference to FIG. 2, the entire high resolution video image consists of 1500 pixels on each of 960 active video image lines. By selectively reading out portions of the RAM the high resolution image may be divided into video sub-images representing quadrants A, B, C and D of the high resolution image. Each quadrant sub-image has 480 lines each containing 750 pixels which corresponds to a standard NTSC video image. The addressing and reading out of the RAM 20 produces a standard NTSC video signal, at the output of the mixer 28, having 525 TV lines (of which 480 are active video) and a 2:1 interlace within 1/30 of a second. For example, quadrant A may be read out by sequentially addressing RAM locations containing pixels in the first half of the topmost scan line. This sub-line of pixels is read out at the NTSC line scan rate. The output video signals from RAM 20 are reconverted to analog form by a digital to analog converter 26 and fed to the mixer 28. The clock 22 and sync circuit 30 supply the horizontal sync pulses at the end of each scan line. Then the first half of each subsequent line in quadrant A is readout in a field interlaced manner. At the bottom of each field, the sync pulse circuit 30 supplies a vertical blanking interval signal.

Each quadrant is read out in succession to form 4 separate analog video image signals. These output signals from the mixer 28 representing the four separate video sub-images are then fed to the video disk mastering apparatus 32 to produce a video disk on which the quadrant sub-images are stored. Alternatively, the output of the mixer 28 may be stored temporarily on video tape for later mastering or in some other form of archival storage. The video disk mastering produces a video disk schematically shown by the dashed line 34.

The high resolution image may be retrieved from the video disk by placing it into a video disk player 36 which sequentially reads the disk to play back each of the video sub-images. The output signal from the video disk layer 36 is fed to a second analog-to-digital converter 38 and to a color burst detector 40. The color burst detector 40 recovers the color burst signal from the playback of the video disk and uses the color burst as a timing reference for the second analog-to-digital converter 38. The digitized video sub-images are stored in portions of a second random access memory 42. In the case where the sub-images are quadrants of the high resolution video image the sub-images may be stored in physical quadrants of the RAM 22 so as to form a composite image much like that as shown in FIG. 2. Specifically, the topmost line of the quadrant B sub-image is stored in adjacent locations to the topmost line of the quadrant A sub-image and so on. The tops of sub-images C and D abut the bottoms of sub-images A and B respectively. Alternatively, the retrieved sub-images can be stored in non-contiguous portions of RAM 42 in a known manner so that control 4 is able to properly address each portion so as to reconstitute the original high resolution image. The horizontal and vertical sync pulses of each sub-image signal are not stored in RAM 42, only the image pixels. The proper sync pulses for the high resolution video image signal may be pre-loaded in the proper RAM locations upon start up of the system 10. The storage and subsequent readout of the RAM 42 is governed by a control circuit 44.

Once all of the video sub-images have been stored in the RAM 22 they may be readout as one image and fed to a second digital-to-analog converter 46 which converts the output of RAM 42 to an analog video signal which is fed to and displayed on a high resolution monitor 48. During the read out, the first half of each high resolution scan line comes from either the A or C sub-image and the second half of the scan line from the corresponding line of the B or D sub-image.

By utilizing the video still image storage system 10 a high resolution image may be broken up into sub-images having a number of lines and pixels on each line which correspond to a standard television format. By breaking the high resolution image up into standard format sub-images, a conventional video recording system, such as, for example, a commercial video disk player, may be used to store the high resolution image without the need for a special high resolution image recorder. This enables relatively inexpensive and easily obtainable equipment to be used for the archival storage of the still image.

What is claimed is:

1. A system for storing information concerning a high-resolution optical image, said system comprising:
    a video camera for acquiring an optical image and converting it to a raster-scanned video signal having p picture elements per line trace interval, p being an integer substantially greater than 750;
    an analog-to-digital converter sampling said video signal at a sampling rate of p samples per line trace interval and digitizing the video signal samples;
    a digital frame storage memory having a number of addressable storage locations at least p times the number of active scan lines in said video signal from said video camera;
    means for writing the digitized video signal samples into respective storage locations of said digital frame storage memory while sequentially addressing its storage locations at said sampling rate in accordance with a first pattern;
    means for subsequently reading from these storage locations of said digital frame storage memory while addressing them in accordance with a second pattern so related to the first as to permute the samples of said video signal in digitized sampled form so as to describe separate raster scannings of respective rectangular areas that are portions of said optical image, which portions are subimages that individually have no more than half the number of picture elements per scan line as the digitized video signal from said analog-to-digital converter and that collectively form the entire said optical image; and
    means for recording said separate raster scannings on a recording medium.

2. A system as set forth in claim 1 wherein said means for recording said separate raster scannings on a recording medium includes;
    a digital-to-analog converter for converting said separate raster scannings to analog form; and
    means for recording said separate raster scannings in analog form sequentially on said recording medium.

3. A system as set forth in claim 2 wherein said recording medium is a video disc.

4. A system as set forth in claim 2 wherein each raster scanning of said video camera video signal is carried out over a time interval longer than the time interval for each of said separate raster scannings of a subimage by a factor equal to the number of subimages in said optical image.

5. A system as set forth in claim 2 wherein said video signal has at least 960 active lines per frame; and wherein said optical image is divided into an m-column-by-n-row array of equal-size rectangular subimages, m being a positive integer at least two and n being a positive integer at least two.

6. A system as set forth in claim 5 wherein m=n=2.

7. A system as set forth in claim 1 wherein each raster scanning of said video camera video signal is carried out over a time interval longer than the time interval for each of said separate raster scannings of a subimage by a factor equal to the number of subimages in said optical image.

8. A system as set forth in claim 1 wherein said video camera is a color camera supplying a composite color video signal having a baseband luminance component and having chrominance components modulated on a color subcarrier frequency; and wherein said analog-to-digital converter digitizes said composite color video signal at a sampling rate that is a multiple of said color subcarrier frequency.

9. A system as set forth in claim 8 wherein said digitized video signal samples are read from said digital frame storage memory at the same rate they are written into said digital frame storage memory, and wherein each raster scanning of said video camera video signal is carried out over a time interval longer than the time interval for each of said separate raster scannings of a subimage by a factor equal to the number of subimages in said optical image, whereby the same color subcarrier frequency can be used in said video camera as in the analog video signal segments recorded in said recording medium.

10. A system as set forth in claim 1 wherein said video signal has at least 960 active lines per frame; and wherein said optical image is divided into an m-column-by-n-row array of equal size rectangular subimages, m being a positive integer at least two and n being a positive integer at least two.

11. A system for processing information supplied in a first analog video signal, describing an optical image composed of an m-column-by-n-row array of contiguous rectangular subimage areas sequentially individually raster scanned, thereby to generate a second analog video signal, m being the number of subimage areas in the direction of scan lines and being at least two, n being the number of subimage areas in the direction perpendicular to scan lines, said system comprising:
  an analog-to-digital converter for converting said first analog video signal to successive digitized video signal samples at a picture element sampling rate;
  a digital frame storage memory having a number of addressable storage locations at least as large as the number of picture elements for each optical image;
  means for writing the digitized video signal samples into respective storage locations of said digital frame storage memory while sequentially addressing its storage locations at said picture element sampling rate in accordance with a first pattern;
  means for subsequently reading digitized video signal samples from these storage locations of said digital frame storage memory while addressing them in accordance with a second pattern so related to the first as to generate a raster scanning of the entire image; and
  a digital-to-analog converter for converting to said second analog video signal the digitized video signal samples read from said digital frame storage memory.

12. A system as set forth in claim 11 in combination with:
  means for playing back from a recording medium to obtain said first analog video signal.

13. A system as set forth in claim 12 in combination with:
  a display monitor for displaying optical images responsive to said second analog video signal.

14. A combination as set forth in claim 11 in combination with:
  a display monitor for displaying optical images responsive to said second analog video signal.

15. A system as set forth in claim 11 wherein n is at least two.

16. A system for processing information supplied in an analog first composite color video signal describing an optical image composed of an m-column-by-n-row array of contiguous rectangular subimage areas sequentially individually raster scanned, thereby to generate a second composite color video signal, m being the number of subimage areas in the direction of scan lines and being at least two, n being the number of subimage areas in the direction perpendicular to scan lines, each of said first and second composite color video signals having a respective baseband luminance component and having respective chrominance components modulating a respective color subcarrier frequency, said system comprising:
  an analog-to-digital converter for sampling said first composite color video signal at a multiple of its color subcarrier frequency to define respective picture elements and digitizing the resultant samples;
  a digital frame storage memory having a number of addressable storage locations at least as large as the number of picture elements for each optical image;
  means for writing the digitized video signal samples into respective storage locations of said digital frame storage memory while sequentially addressing its storage locations at said multiple of the color subcarrier frequency of said first composite color video signal, in accordance with a first pattern;
  means for subsequently reading the digitized video signals from these storage locations of said digital frame storage memory while addressing them at a multiple of the color subcarrier frequency of said second composite color video signal, in accordance with a second pattern so related to the first as to generate a raster scanning of the entire optical image; and
  a ditigal-to-analog converter for converting to said second composite color video signal the digitized video signal samples read from said digital frame storage memory.

17. A system as set forth in claim 16 in combination with:
  means for playing back from a recording medium to obtain said first composite color video signal.

18. A system as set forth in claim 16 in combination with:
  a display monitor for displaying color images responsive to said second composite color video signal.

19. A system as set forth in claim 16 in combination with:
  means for playing back from a recording medium to obtain said first composite color signal; and
  a display monitor for displaying color images responsive to said second composite color video signal.

20. A system as set forth in claim 16 wherein n is at least two.

21. A system as set forth in claim 16 wherein the color subcarrier frequencies of said first and second composite color video signals are alike.

* * * * *